United States Patent [19]

Leggett et al.

[11] 4,144,504
[45] Mar. 13, 1979

[54] PLANAR LASER MOUNT

[75] Inventors: Norman D. Leggett, Hoddesdon; Richard E. Epworth, Bishops Stortford, both of England

[73] Assignee: International Standard Electric Corporation, New York, N.Y.

[21] Appl. No.: 783,874

[22] Filed: Apr. 1, 1977

[30] Foreign Application Priority Data

May 11, 1976 [GB] United Kingdom ............... 19323/76

[51] Int. Cl.² .............................................. H01S 3/19
[52] U.S. Cl. ........................ 331/94.5 P; 331/94.5 H; 357/68; 357/74; 357/81
[58] Field of Search ...................... 357/81, 74, 17, 18, 357/19, 75, 76, 68; 331/94.5 H, 94.5 P

[56] References Cited

U.S. PATENT DOCUMENTS

| 2,880,383 | 3/1959 | Taylor ................................. 357/74 |
| 3,840,889 | 10/1974 | O'Brien et al. ........................ 357/81 |
| 3,869,702 | 3/1975 | Backhouse et al. .................... 357/74 |

Primary Examiner—Stanley D. Miller, Jr.
Assistant Examiner—James W. Davie
Attorney, Agent, or Firm—John T. O'Halloran; Peter C. Van Der Sluys

[57] ABSTRACT

An injection laser mount assembly comprises a housing having a front surface extending in a plane parallel with a rear surface. The front surface has a central recess from which a pillar extends for carrying a laser. Optical coupling can be made with the laser by converting the mount assembly to an optical fiber termination.

7 Claims, 9 Drawing Figures

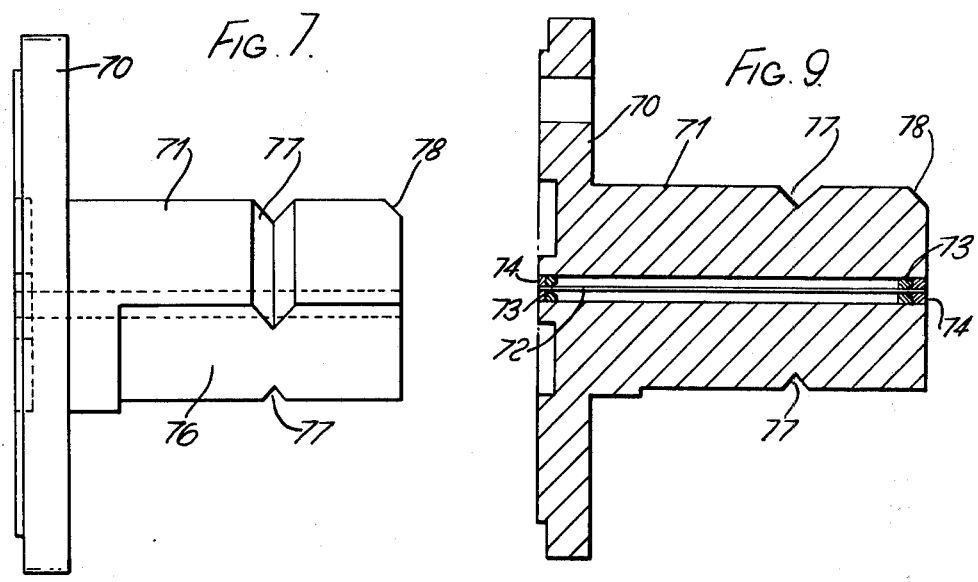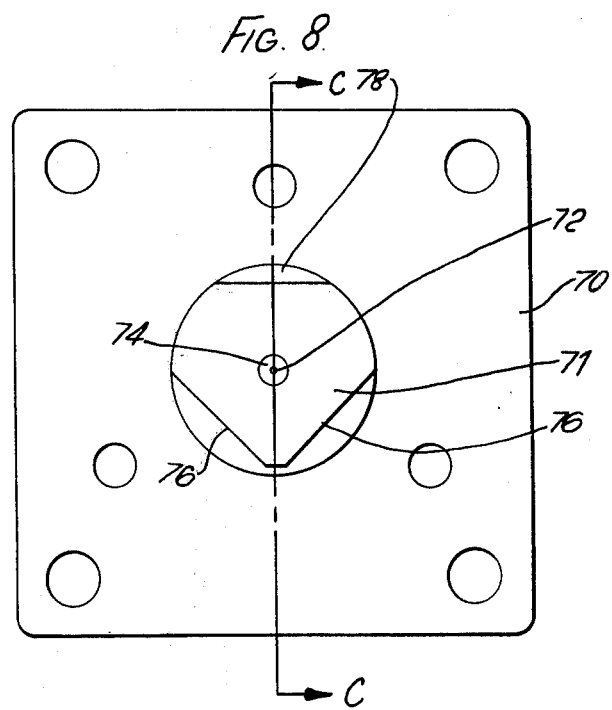

PLANAR LASER MOUNT

BACKGROUND OF THE INVENTION

This invention relates to injection laser mounts, and is an improvement over the state of the art of laser mount devices as described in U.S. Patent application Ser. No. 670,323 filed Mar. 25, 1976 now U.S. Pat. No. 4,097,891 issued June 27, 1978 and assigned to the assignee of this invention.

SUMMARY OF THE INVENTION

According to the present invention there is provided an injection laser mount including and electrically conductive housing having a flat rear surface and a front surface extending in a plane parallel with the rear surface. The front surface has a central recess from the base of which protrudes an electrically conductive pillar, which terminates at, or short of, the plane of the housing front surface, and which together with the housing provides one terminal connection for an injection laser secured to one side of the pillar. The laser axis is aligned substantially normal to the housing rear surface and the other terminal connection is provided by a strip-line secured in a slot extending from the side of the housing into the recess. The strip-line extends substantially parallel with the housing rear surface to a bend beyond which it extends substantially parallel with the side of the pillar to which the laser is secured. The housing is provided with a window in its base for the transmission therethrough of laser radiation emitted from the rear face of the laser.

Preferably the pillar is made of a material having a different coefficient of thermal expansion from that of the material of the housing. This enables the top of the pillar and the housing front surface to be worked at a particular temperature to a common plane. This particular temperature is chosen in relation to the components of the mount so that, when the assembly is subsequently taken to the working temperature of the mount, the differential expansion causes the surface of the pillar to be recessed a predetermined small distance from the front surface of the housing. The laser may then be mounted with its front face as close to the top surface of the pillar as is consistent with good heat sinking, in which position its output can be efficiently coupled into the end of an optical fiber that terminates flush with a flat plate held against the housing front surface.

Conveniently the housing has its rear surface clamped against a heat sink during operation of the laser.

BRIEF DESCRIPTION OF THE DRAWING

FIG. 7 is a side view of an alternate embodiment of a fiber termination plate for use with the mount of this invention;

FIG. 8 is a side view of the plate of FIG. 7; and

FIG. 9 is a vertical section of the plate of FIG. 7 taken along line C—C of FIG. 8.

DESCRIPTION OF THE PREFERRED EMBODIMENT

Figure 1:
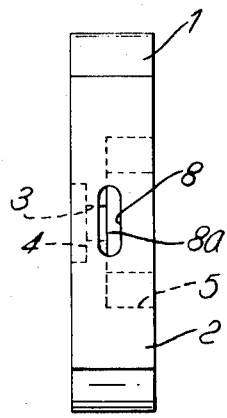
FIG. 1 is a side view of the mount of this invention before the fitting of the laser or its strip-line terminal connection.
Figure 2:
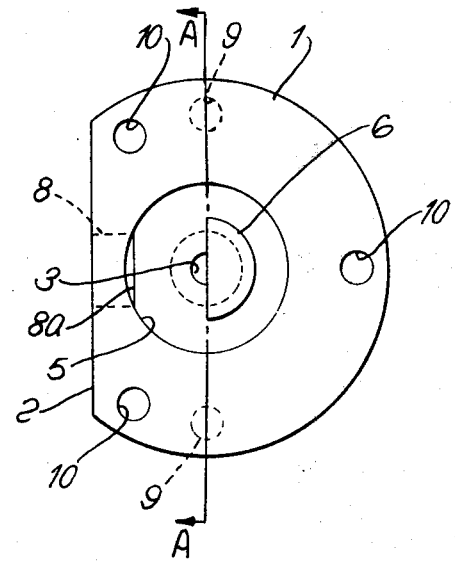
FIG. 2 is a plan view of the mount of FIG. 1.
Figure 3:
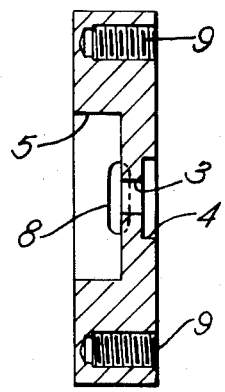
FIG. 3 is a plan view of the mount of FIG. 2 taken along line A—A thereof.

Referring to FIGS. 1, 2 and 3, a laser mount housing consists of a substantially disc shaped housing member 1. A portion of the curved surface of the disc is removed to leave a flat surface 2. This housing 1 is made of mild steel suitable for glass-to-metal sealing, such as steel to British Standard BS 70EN1A. A through hole 3 is provided on the axis of the disc, and both ends of this hole are counterbored. The lower end is counterbored to provide a recess 4 in the rear face to accommodate a window, while the upper end is counterbored to provide a larger recess 5 in the front face to accommodate freely a pillar 6. This pillar 6, which is made of oxygen-free high conductivity copper, is secured to the base of recess 5 by silver soldering or some other suitable method such as fusion welding. In cross section the pillar is D-shaped, and is secured with the flat of the D parallel with the flat 2 on the housing 1. Eventually an injection laser 7 (FIG. 4) is secured to the flat side face of the D, and so the pillar 6 is mounted with its flat face displaced from the housing axis by the amount required to bring the laser emission axis on to the housing axis.

Figure 4:
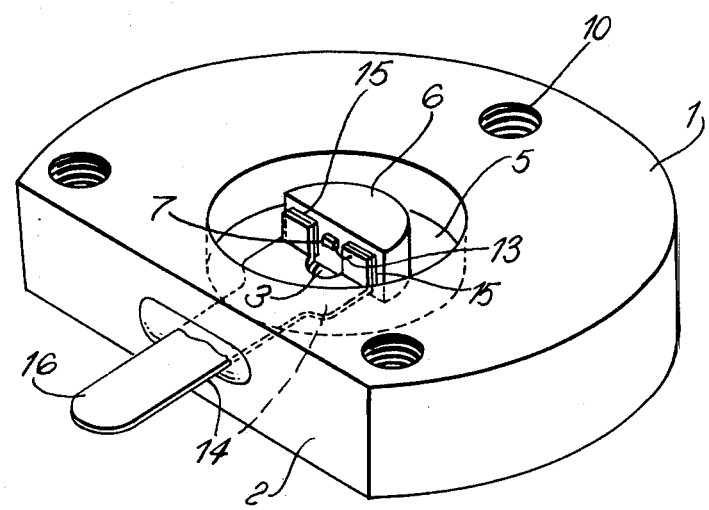
FIG. 4 is a top perspective view of the mount of FIG. 1; after the fitting of the laser and its strip-line terminal connection.

Extending from the flat face 2 to the larger recess 5 is a slot 8 to accommodate a strip-line as shown in FIG. 4. A pair of blind tapped holes are provided at 9 by which the housing may be secured to a heat sink and a further set of tapped holes 10 are provided for securing an optical fibre termination plate of the type to be described subsequently with reference to FIG. 5.

The top of the pillar 6 is required to be slightly beneath the level of the surrounding front surface of the housing 1 so that it shall not touch the end of the optical fiber when the termination plate is secured to the housing. On the other hand it should be as close as possible to this level, in order to maximise the amount of light that can be launched into the fiber. A small difference in heights, typically no more than a few microns, is provided by taking advantage of the difference in thermal expansion between the copper of the pillar 6 and the steel of the housing 1. The top surface of the pillar 6 and the surrounding front surface of the housing 1 are worked to a common plane at an elevated temperature above the intended maximum service temperature of the completed mount. Then, as the two components cool down, the copper shrinks faster than the housing to give the required difference in heights. A preferred sequence of steps for working the surfaces is to lap and polish them at room temperature, then to heat the assembly before giving it a final polish with rouge at an elevated temperature. This final polish with rouge is normally a rapid process taking only a few seconds, and hence can be performed on a lap at room temperature if necessary. Clearly better control of tolerances is more readily obtained if the final polish is performed on a heated lap. With a pillar height of 2.8mm, a height difference of 0.5um was obtained at a service temperature of 20° C. by performing the final polish at 60° C. on a lap heated to 60° C. The height difference calculated from data of the expansion coefficients of the mild steel and the copper is 0.6um. The discrepancy between the there-theoretical and practical values may be attributable in part to the presence of the silver solder layer between the copper and the mild steel, in part to the rouge becoming broken down while travelling across the face of the steel before it reaches the copper, and in part to the different polishing speeds of the two materials. After the final polish, the whole assembly is plated with gold.

Referring now particularly to FIG. 4, the pillar 6 provides one terminal connection for the laser 7, while the other is provided by way of a fine gold tape or braid 13 secured to the end of a strip-line 14. The strip-line 14 is made of a low expansion nickel iron alloy suitable for sealing in glass, and is gold plated.

This strip-line 14, which is bifurcated, has a right-angled bend near the bifurcated end so that the main portion extends parallel with the major faces of the housing 1, while the ends of its two prongs extend parallel with the flat side face of the pillar 6 on either side of the region where the laser is to be mounted. In the construction illustrated use is made of only one of the prongs. Two prongs have been provided so that, if desired, the characteristic impedance of the terminal connection can be lowered by the use of a longer tape or braid 13 extending between the two prongs and connected at its midpoint to the laser. Alternatively each prong may be separately provided with its own tape or braid separately connected with the laser.

A resin coated woven glass fiber matting adhesive preform is stuck to the underside of the strip-line to hold it spaced a predetermined distance above the level of the base of the larger recess 5. A pair of adhesive preforms 15 made of the same material are also stuck to the rear surfaces of the ends of the prongs of the strip line to hold them spaced a predetermined distance from the pillar. The single end of the strip line is introduced through the slot 8 in the housing 1 and positioned so that the prongs at the other end terminate short of the top of the pillar by about 0.2mm. Then the housing is supported with its slot uppermost while a glass frit preform is slipped over the single end of the strip line and into the slot. The slot 8 is positioned so that part of it is above the base of the recess 5 and part beneath (see FIGS. 3 and 4). Thus, the ledge 8a is formed at the inner end of the slot where it opens into the recess. This ledge prevents the glass frit preform from slipping right through the slot, and holds the preform in position while it is fired to form a glass to metal seal for the strip-line. Alternatively the slot may be formed flush with the base of the recess 5 and the preform held in position by one or more lugs formed in the strip line. The firing also serves to cure the three glass fiber matting adhesive preforms. The final stage before fitting the laser 7 is the fitting of a glass window in the smaller recess 4. One method of sealing the window in the recess 4 is to wrap a resin coated woven glass matting adhesive preform round the curved surface of the window, place the window in the assembly, and fire it to cure the preform. An alternative method involves coating the curved surface of the window with a silver-palladium metallising paste supplied by Electro-Science Laboratories, Inc. under the designation No. 9635. The metallisation provided by this paste enables the window to be secured in the recess 4 by conventional metallic soldering using a 60:40 tin:lead soft solder. A further alternative method dispenses with the metallisation and uses a low melting point glass as a glass solder instead of metallic solder.

A small quantity of resin flux is applied to the side of the pillar 6 where the laser is to be mounted, and to this is applied a solder preform made of indium. A suitable quantity is provided by a sphere 0.18mm in diameter. The pillar 6 is heated to cause the indium to wet the surface, and then the wetted surface is used to wet the free end of the gold tape 13. After the tape 13 has been wetted, it is bent back so that the laser 7 can be placed in position on the wetted surface of the pillar 6. The laser 7 is placed face down on the side of the pillar 6 and fine adjustments to its position are made with a wooden probe. It has been found preferable to mount the laser 7 with its tip set back a short distance from the top of the pillar because, if it mounted flush with the top, the heat sinking is impaired. It is believed that this impairment is attributable at least in part to the presence of a radius at the junction between the flat side and top surfaces of the pillar. Typically it is preferred to set the top of the laser 7 back from the top of the pillar 6 by about 18um. In choosing the distance a compromise has to be set between the considerations of achieving good heat sinking, while not unduly obstructing the forward emission of the laser radiation with the shoulder to the pillar 6. Another consideration, when the light is to be launched into a fiber, is the need for close proximity between the laser face and the fiber end, in order to achieve good light launching efficiency.

Next, a second indium preform, identical with the first, is applied to the back of the laser 7, and then the tape 13 is bent forward to bed on to this now molten second indium preform. Readjustment of the position of the laser may be necessary at this stage, and then the assembly is removed from the heat source.

The primary intended use of this construction of laser mount is for launching the laser radiation into the end of an optical fiber termination flush with the face of a plate that can be clamped against the front face of the laser mount. A construction of such a fiber termination plate will now be described with reference to FIGS. 5 and 6. The fiber termination plate consists essentially of a steel plate 50 provided with an integral hollow stem 51 through which an optical fiber 52 is threaded to terminate substantially at the face of a watchmaker's pierced hearing jewel 53. The fiber 52 is required to be flush with the front face of the plate, and is provided with a plastics sheath 54, the end portion of which is stripped away to expose the bare fiber, which is a sliding fit through the aperture in the jewel 53. The jewel itself is a push fit in the bore of the stem which is counterbored to accommodate the fibre sheath 54. The jewel has a dished face which is arranged to face up the stem in order to facilitate the threading of the fiber. The fiber is secured in position in the stem with a resin 55.

Initially the bare fiber protrudes a short distance beyond the front face of the plate 50, but the protruding part is removed by polishing to leave a polished end surface flush with the front face of the plate 50. In order not to have to polish the hard material of the jewel, the jewel is slightly recessed and covered with a layer 56 of a curing material such as cyanoacrylate adhesive.

In order to reduce the area to be polished, an annular grove 57 is machined in this face; and the flange 58, by which the plate 50 may be secured, is set back with respect to the front face. Optionally a further annular groove may be machined in the face to house an O-ring so that the plate 50 can be O-ring sealed to the laser mount housing 1. The plate 50 is provided with a set of three holes 59 which register with the holes threaded in the laser mount for clamping the mount to the plate. The flange 58 is provided with a set of four holes 60 by which the whole assembly may be clamped to some other structure.

Figure 5:
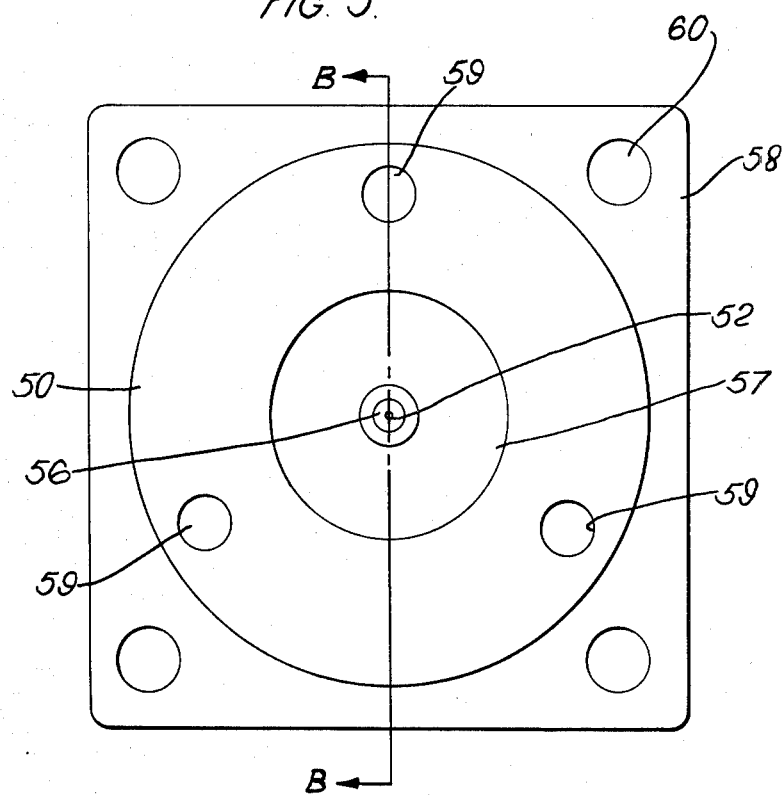
FIG. 5 is an enlarged plan view of a fiber-termination plate for use with the mount of FIG. 1.
Figure 6:
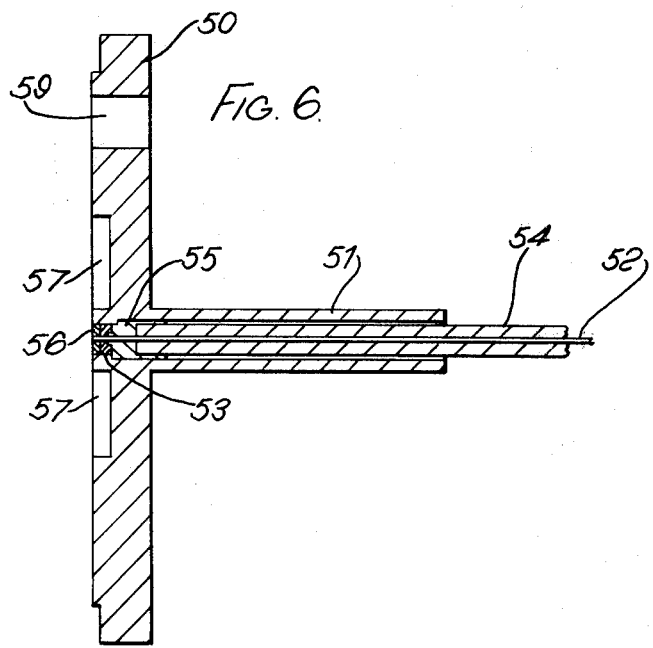
FIG. 6 is a sectional view of the plate of FIG. 5 taken along line B—B thereof.

In the fiber termination plate of FIGS. 5 and 6 the fiber 52 extends beyond the end of the stem 51, but in an alternative construction it terminates in a polished end face flush with the top end of the stem 51. An example of such a termination plate will now be described with reference to FIGS. 7, 8 and 9. This fiber termination plate consists essentially of a steel plate 70 provided with an integral hollow stem 71 through which an optical fiber 72 is threaded to terminate at each end substantially at the face of one of a pair of watchmaker's pierced bearing jewels 73. Each jewel 73 has one dished face and preferably both jewels 73 are arranged in the termination so that the dished faces face in the same direction in order to facilitate the threading of the fiber through the jewels 73.

The two jewels 73 are slightly recessed with respect to the face of the plate 70 and the end face of the stem 71, so that when the fiber is secured in position, its ends can be polished flush with these faces without having to polish the jewel faces. Initially the optical fiber 72 is slightly longer than the termination and, when threaded through the two jewels is secured with its ends protruding by the application of layers 74 of a curing material, such as cyanoacrylate adhesive. When this has cured, the two ends of the fiber 72 are polished flush with the ends of the termination.

The shape of the plate 70 is identical with that of the corresponding plate 50 of the termination described previously with respect to FIGS. 5 and 6. The stem 71 is larger in diameter than its counterpart in the other termination so that it can be adapted to fit other types of connectors. For this purpose two flats 76 are machined on its sides, a groove around its circumference at 77, and a bevel at 78.

The mating part of the connector is provided with a V-shaped groove for accommodating the two flats 76. It also has a spring urged detent, which engages the groove 77 and holds the stem in the V-groove and at the same time, by bearing on the forward face of the circumferential groove 77, urges the stem into the mating part.

The mating part of the connector includes a further optical fiber whose end is required to be positioned exactly opposite the end of the fiber in the termination plate in order to provide the maximum coupling efficiency. To this end provision is made for fine adjustment of position of the fiber mounted in the mating part. The fiber in the mating part terminates in a ferrule, which, near the mating end, is secured through a flexible diaphragm, and which, near the other end is laterally movable by fine adjustment means such as pairs of opposed set screws. The ferrule acts as a lever pivoted at the diaphragm so that fine adjustment of the adjustment means is translated into ultrafine positional adjustment of the fiber end.

As an alternative to making use of differential thermal expansion effects to hold the pillar 6 of the laser mount spaced from the plate of an optical fiber termination plate, a spacer of plated or evaporated material may be used. One way of providing this spacer is to mask the end face of the pillar 6 after it has been polished flush with the front face of the housing 1, and then to deposit material on the front face of the housing by plating or evaporation, after which the mask is removed. Another way of providing the spacer involves the same process, but in this instance applied instead to the face of plate of the optical fiber termination plate.

When the optional fiber termination plate is first applied to the laser mount it is loosely clamped to the mount. At this stage the laser is energised and small adjustments to their relative position are made to optimise the light output from the optical fiber before the two parts are firmly clamped together.

Where the use of resins, cyanoacrylates and the like cannot be tolerated the matting adhesive preforms may be replaced with glass preforms fired on the strip-line and the curing material securing the fibers in the jewels replaced with a low melting point solder glass.

It is to be understood that the foregoing description of specific examples of this invention is made by way of example only and is not to be considered as a limitation on its scope.

We claim:

1. A laser device, comprising:
an electrically conductive housing having a flat rear surface and a flat front surface extending in a plane parallel with said rear surface;
a central recess formed in said front surface and being partially defined by a base surface;
a slot formed in a side of said housing and extending from the exterior thereof into said recess;
a window formed in said housing and extending from said base surface of said recess to said flat rear surface for providing an opening through said housing;
an electrically conductive pillar mounted within said recess on said base surface and having an upper surface thereof terminating approximate said plane of said housing front surface and having a second surface substantially normal to said housing rear surface and aligned with said window of said housing, said electrically conductive pillar being in electrical connection with said electrically conductive housing for providing a terminal connection for an injection laser;
an injection laser secured to said second surface of said pillar and positioned to have its laser axis aligned substantially normal to said housing rear surface and in alignment with said window;
a strip-line for providing another terminal connection for said laser, said strip-line secured in said slot and extending substantially parallel with said base surface from the exterior of said housing into said recess to a bend beyond which it extends substantially parallel with said second surface of said pillar to which said laser is secured; and
means for electrically connecting said strip-line to said laser.

2. A laser device as described in claim 1, wherein said strip-line is securely mounted to said base surface and to said second surface of said pillar.

3. A laser device as described in claim 2, additionally comprising insulative material disposed between said strip-line and said base surface and said second surface of said pillar.

4. A laser device as described in claim 1, wherein said strip-line is bifurcated at the end nearest said laser and an electrical connection is provided between each of the bifurcated ends of said strip-line and said laser.

5. A laser device as described in claim 1, wherein said pillar is formed of copper and said housing is formed of a material having a lower coefficient of expansion than that of said copper.

6. A laser device as described in claim 1, wherein said upper surface of said pillar is recessed with respect to said front surface of said housing.

7. A laser device as described in claim 1, wherein a portion of said strip-line extending through said slot in said housing is sealed to said housing by a glass frit.

* * * * *